United States Patent
Van Der Heijden et al.

(10) Patent No.: US 7,746,176 B2
(45) Date of Patent: Jun. 29, 2010

(54) RECEIVER COMPRISING AN AMPLIFIER

(75) Inventors: Edwin Van Der Heijden, Eindhoven (NL); Hugo Veenstra, Kleine Brogel (BE)

(73) Assignee: ST-Ericsson SA, Geneva (CH)

( * ) Notice: Subject to any disclaimer, the term of this patent is extended or adjusted under 35 U.S.C. 154(b) by 0 days.

(21) Appl. No.: 11/815,966

(22) PCT Filed: Jan. 30, 2006

(86) PCT No.: PCT/IB2006/050321

§ 371 (c)(1),
(2), (4) Date: Jun. 6, 2008

(87) PCT Pub. No.: WO2006/085239

PCT Pub. Date: Aug. 17, 2006

(65) Prior Publication Data

US 2008/0297255 A1    Dec. 4, 2008

(30) Foreign Application Priority Data

Feb. 9, 2005    (EP)    ................................. 05100912

(51) Int. Cl.
*H03F 3/04* (2006.01)
(52) U.S. Cl. ........................ 330/301; 330/302; 330/252
(58) Field of Classification Search ................. 330/301, 330/302, 252
See application file for complete search history.

(56) References Cited

U.S. PATENT DOCUMENTS

| 6,002,860 | A | * | 12/1999 | Voinigescu et al. | ........... 703/14 |
| 6,057,714 | A |   | 5/2000  | Andrys et al.     |   |
| 6,259,325 | B1 |  | 7/2001  | Ishizuka et al.   |   |
| 6,809,581 | B2 | * | 10/2004 | Rofougaran et al. | ........ 327/563 |
| 6,850,746 | B1 | * | 2/2005  | Lloyd et al.      | ................. 455/272 |
| 7,209,727 | B2 | * | 4/2007  | Castaneda et al.  | ........... 455/341 |
| 7,375,590 | B2 | * | 5/2008  | Su et al.         | ..................... 330/301 |
| 2002/0187768 | A1 | | 12/2002 | Lin |   |
| 2003/0042983 | A1 | | 3/2003  | Hollenbeck et al. |   |
| 2003/0197575 | A1 | | 10/2003 | Rofougaran et al. |   |

FOREIGN PATENT DOCUMENTS

| EP | 0472340 A1 | 2/1992 |
| WO | 2006085238 A1 | 8/2006 |

OTHER PUBLICATIONS

International Search Report dated Jun. 14, 2006 in connection with PCT Patent Application No. PCT/2006/050321.
Written Opinion of the International Searching Authority dated Aug. 9, 2007 in connection with PCT Patent Application No. PCT/2006/050321.

* cited by examiner

*Primary Examiner*—Patrica Nguyen

(57) ABSTRACT

The invention relates to a receiver (1) comprising an amplifier (31-34) for amplifying an antenna signal, which amplifier (31-34) comprises an amplifier input (11*a*) and an amplifier output (12*a*, 12*b*), the amplifier input (11*a*) being a single ended input for receiving the antenna signal, the amplifier output (12*a*, 12*b*) being a differential output, and the amplifier (31-34) comprising a circuit (54) for compensating a series input impedance of the amplifier (31-34).

20 Claims, 3 Drawing Sheets

RECEIVER COMPRISING AN AMPLIFIER

This patent application is related to application Ser. No. 11/815,965 in that both share a common owner, the same inventors, and the same priority, international, and US filing dates.

CROSS-REFERENCE TO RELATED APPLICATION(S)

The present application claims priority under 35 U.S.C. §365 to International Patent Application No. PCT/IB2006/050321 filed Jan. 30, 2006, entitled "RECEIVER COMPRISING AN AMPLIFIER". International Patent Application No. PCT/IB2006/050321 claims priority under 35 U.S.C. §365 and/or 35 U.S.C. §119(a) to European Patent Application No. 05100912.4 filed Feb. 9, 2005 and which are incorporated herein by reference into the present disclosure as if fully set forth herein.

The invention relates to a receiver comprising an amplifier, and also relates to an amplifier, and to a method.

Examples of such a receiver are wireless receivers, wireless transceivers and wireless interfaces.

A prior art receiver is known from US 2003/0042983 A1, which discloses a receiver comprising an amplifier for amplifying a radio frequency signal (an antenna signal). The amplifier comprises two transistors and an amplifier input and an amplifier output. First main electrodes of the two transistors constitute the amplifier input and second main electrodes of the two transistors constitute the amplifier output. This amplifier input is a differential input and this amplifier output is a differential output.

To couple a single ended antenna to a differential input, a balun must be used. Such a balun requires, when being on chip, relatively much chip area, and results in signal losses and increased noise figures. To avoid such a balun, only one of the first main electrodes is to be used as an amplifier input. This amplifier input is then a single ended input for receiving the antenna signal. Owing to the fact that the amplifier input is used as a single ended input, there will be some impedance mismatching, which results in signal losses. To reduce the impedance mismatching, an impedance matching resistor had to be introduced. This impedance matching resistor, which adds relatively much noise, is located in parallel to one of two inductors coupled in serial to the first main electrodes of the two transistors.

The known receiver is disadvantageous, inter alia, owing to the fact that the level of the noise figure of the amplifier is relatively high.

It is an object of the invention, inter alia, to provide a receiver comprising an amplifier with a single ended input and a differential output and having a noise figure at a relatively low level while simultaneously providing an input power match.

Further objects of the invention are, inter alia, to provide an amplifier with a single ended input and a differential output and having a noise figure at a relatively low level while simultaneously providing an input power match.

The receiver according to the invention comprises an amplifier for amplifying an antenna signal, which amplifier comprises an amplifier input and an amplifier output, the amplifier input being a single ended input for receiving the antenna signal, the amplifier output being a differential output, and the amplifier comprising a circuit for compensating a series input impedance of the amplifier.

By introducing the circuit for compensating a series input impedance of the amplifier, the input impedance of the amplifier is balanced without needing to introduce a noise generating resistor. As a result, the noise figure of the amplifier is at a relatively low and acceptable level.

An embodiment of the receiver according to the invention is defined by the amplifier comprising a first transistor and a second transistor, control electrodes of both transistors being coupled to each other via a first element, first main electrodes of both transistors being coupled to each other via a second element, and the means being coupled to the first element. These first and second transistors form a first transistor stage such as for example a common emitter stage. Such a transistor stage has a better amplification than the stage disclosed in US 2003/0042983 A1. The second element for example comprises a differential inductor with a center tap or two serial inductors, just like the ones described in US 2003/0042983 A1. One of these serial inductors described in US 2003/0042983 A1 must have a relatively large value, which makes it difficult to realize this inductor on chip. The differential inductor with a center tap or the two serial inductors together forming the second element will have smaller values and can easily be realized on chip.

An embodiment of the receiver according to the invention is defined by the circuit comprising a third transistor, a control electrode of the third transistor being coupled to a control electrode of the second transistor, a first main electrode of the third transistor being coupled to ground via a parallel circuit of a current source and a capacitor, a second main electrode of the third transistor being coupled to a voltage supply. The combination of the third transistor and the parallel circuit compensates the series input impedance of the amplifier to obtain an input power match while providing a single ended input. Other means for compensating the series input impedance of the amplifier are not to be excluded.

An embodiment of the receiver according to the invention is defined by second main electrodes of both transistors being coupled to a cascode circuit comprising the amplifier output. The cascode circuit comprises further transistors and forms a second transistor stage such as a common base stage.

An embodiment of the receiver according to the invention is defined by the first element comprising a differential inductor with a center tap. The function of the differential inductor with a center tap has been shifted from a prior art location in a prior art impedance matching network to its present location. This prior art impedance matching network is for example located between the antenna and a prior art amplifier having a differential input.

An embodiment of the receiver according to the invention is defined by the center tap being coupled to a voltage source. This is done for biasing purposes.

An embodiment of the receiver according to the invention is defined by a control electrode of the first transistor being coupled via a further capacitor to the amplifier input. The function of this further capacitor has been shifted from a prior art location in the prior art impedance matching network to its present location. A function of a yet further capacitor at a prior art location in the prior art impedance matching network has disappeared, owing to the fact that the third transistor is coupled directly to the control electrode of the second transistor without a capacitor being in between.

Embodiments of the amplifier according to the invention and of the method according to the invention correspond with the embodiments of the receiver according to the invention.

The invention is based upon an insight, inter alia, that the level of the noise figure of the prior art amplifier is relatively high. The invention is based upon a basic idea, inter alia, that means for compensating a series input impedance of the amplifier are to be introduced.

The invention solves the problem, inter alia, to provide a receiver comprising an amplifier with a single ended input and a differential output and having a noise figure at a relatively low level while simultaneously providing an input power match. The invention is advantageous, inter alia, in that the noise figure of the amplifier is at a relatively low and acceptable level.

These and other aspects of the invention will be apparent from and elucidated with reference to the embodiments(s) described hereinafter.

Figure 1:
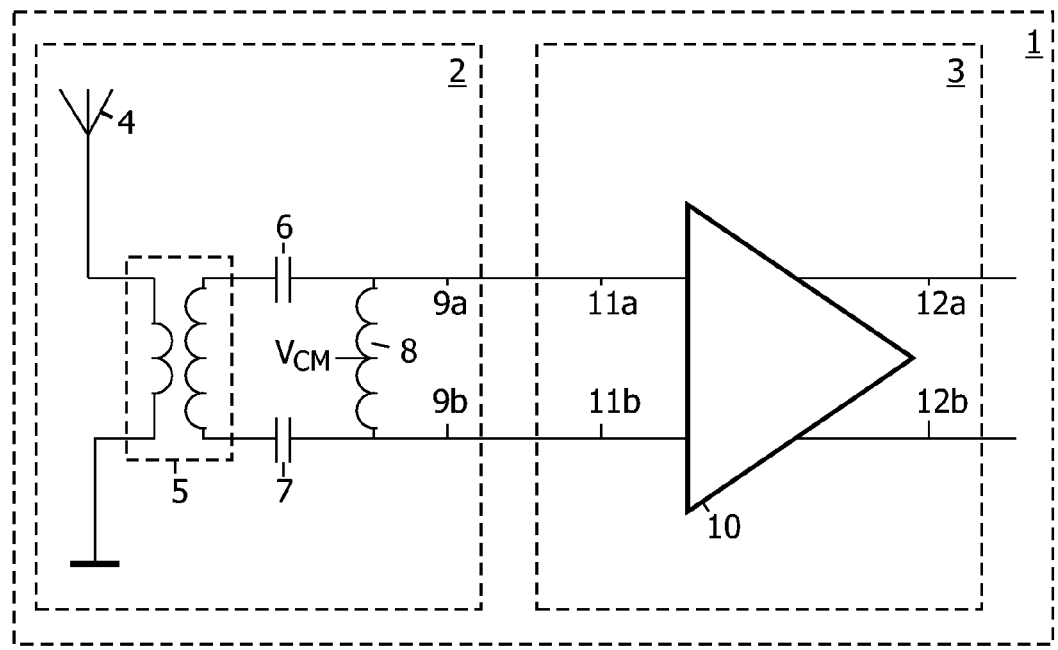
FIG. 1 shows diagrammatically a prior art receiver comprising a prior art amplifier.

The prior art receiver 1 shown diagrammatically in FIG. 1 comprises a prior art antenna stage 2 and a prior art amplifying stage 3. The prior art antenna stage 2 comprises an antenna 4 coupled to ground via one side of a balun 5. The other side of the balun 5 is coupled via capacitors 6 and 7 to an antenna stage output. This antenna stage output 9a,9b comprises a differential output. The ports 9a and 9b are mutually coupled via an inductor 8 having a center tap coupled to a bias voltage $V_{CM}$. The capacitors 6 and 7 and the inductor 8 together form a prior art impedance matching network.

The prior art amplifying stage 3 comprises a prior art low noise amplifier 10 comprising an amplifier input 11a,11b and an amplifier output 12a,12b. The amplifier input 11a,11b comprises a differential input comprising the ports 11a and 11b, and the amplifier output 12a,12b comprises a differential output comprising the ports 12a and 12b.

Figure 2:
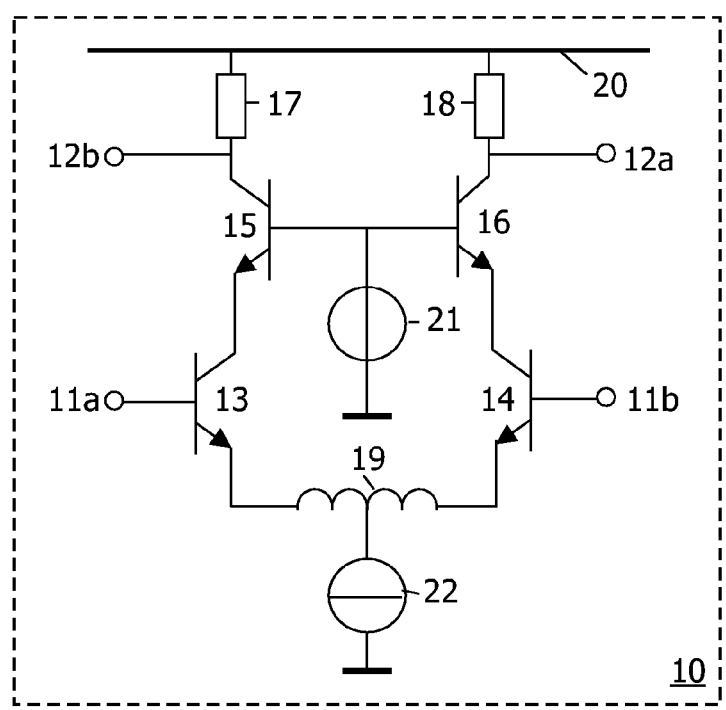
FIG. 2 shows diagrammatically a prior art amplifier in greater detail comprising a differential input and a differential output.

The prior art amplifying stage 3 comprising the prior art low noise amplifier 10 shown diagrammatically in FIG. 2 in greater detail comprises two transistors 13 and 14 of which the control electrodes (bases) form the ports 11a and 11b and of which first the main electrodes (emitters) are coupled to each other via a differential inductor with a center tap 19 or two serial inductors. The center tap of the differential inductor 19 or the common point of the two serial inductors is coupled via a current source 22 to ground. The second main electrodes (collectors) of the transistors 13 and 14 are coupled to first main electrodes (emitters) of transistors 15 and 16, of which the control electrodes (bases) are coupled to each other and via a voltage source 21 to ground. Second main electrodes (collectors) of the transistors 15 and 16 are coupled via resistors 17 and 18 to a voltage supply 20 and form the ports 12b and 12a.

The low noise amplifier 10 shown in the FIGS. 1 and 2 comprises an amplifier input 11a,11b being a differential input. Such a differential input requires a balun 5 to be used in the antenna stage 2. This is a disadvantage. To avoid the balun, an amplifying stage comprising a low noise amplifier with a single ended input and a differential output has been created, for example as follows.

Figure 3:
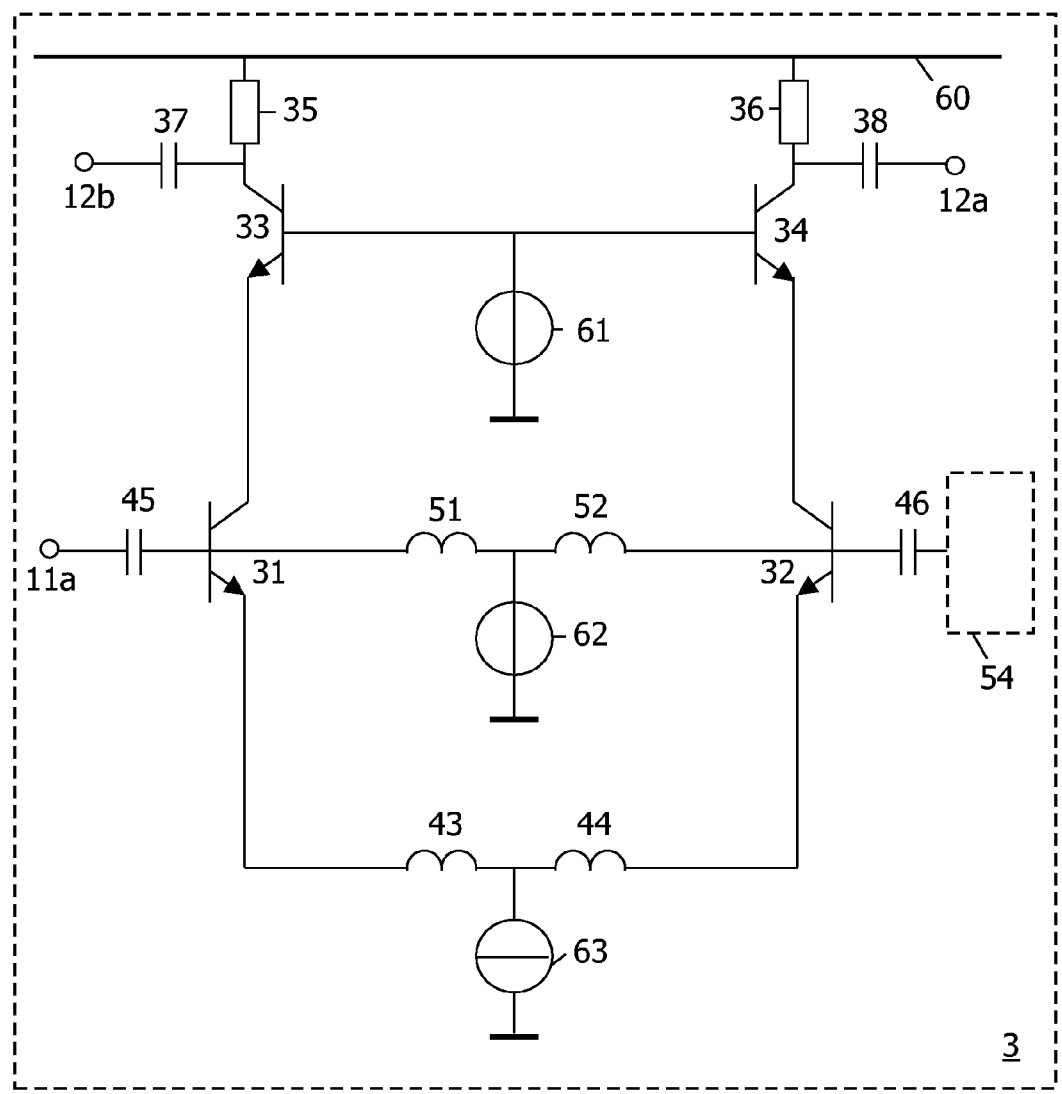
FIG. 3 shows diagrammatically an amplifier according to the invention in greater detail comprising a single ended input and a differential output.

The (low noise) amplifier 31-34 according to the invention shown diagrammatically in FIG. 3 in greater detail comprises a first transistor 31 and a second transistor 32. The control electrodes (bases) of both transistors 31 and 32 are coupled to each other via a first element 51,52. The first main electrodes (emitters) of both transistors 31 and 32 are coupled to each other via a second element 43,44 and the second main electrodes (collectors) of both transistors 31 and 32 are coupled to a cascode circuit 33,34. These first and second transistors 31 and 32 form a first transistor stage such as for example a common emitter stage. The cascode circuit 33,34 comprises further transistors 33 and 34 and forms a second transistor stage such as a common base stage.

The first main electrodes (emitters) of the transistors 33 and 34 are coupled to the second main electrodes (collectors) of the transistors 31 and 32. The control electrodes (bases) of the transistors 33 and 34 are coupled to each other and to a voltage source 61 for biasing purposes. The second main electrodes of the transistors 33 and 34 are coupled via resistors 35 and 36 to a voltage supply 60 and via optional coupling capacitors 37 and 38 to the ports 12b and 12a. The control electrode (base) of the first transistor 31 is coupled via a further capacitor 53 to the port 11a. The control electrode (base) of the second transistor 32 is coupled to means 54 for compensating a series input impedance of the amplifier 31-34. The first element 51,52 comprises a differential inductor 51,52 with a center tap or two inductors 51 and 52. The center tap of the differential inductor 51,52 or the common point of the two serial inductors 51 and 52 is coupled to a voltage source 62 for biasing purposes. The second element 43,44 comprises a differential inductor 43,44 with a center tap or two inductors 43 and 44. The center tap of the differential inductor 43,44 or the common point of the two serial inductors 43 and 44 is coupled to a current source 63 for biasing purposes.

The function of the further capacitor 53 has been shifted from its prior art location in the prior art impedance matching network (capacitor 6 in FIG. 1) to its present location. A function of a yet further capacitor at a prior art location in the prior art impedance matching network (capacitor 7 in FIG. 1) has disappeared, owing to the fact that the means 54 are coupled directly to the control electrode of the second transistor 32 without a capacitor being in between.

The function of the differential inductor 51,52 has been shifted from a prior art location in the prior art impedance matching network (inductor 8 in FIG. 1) to its present location.

Figure 4:
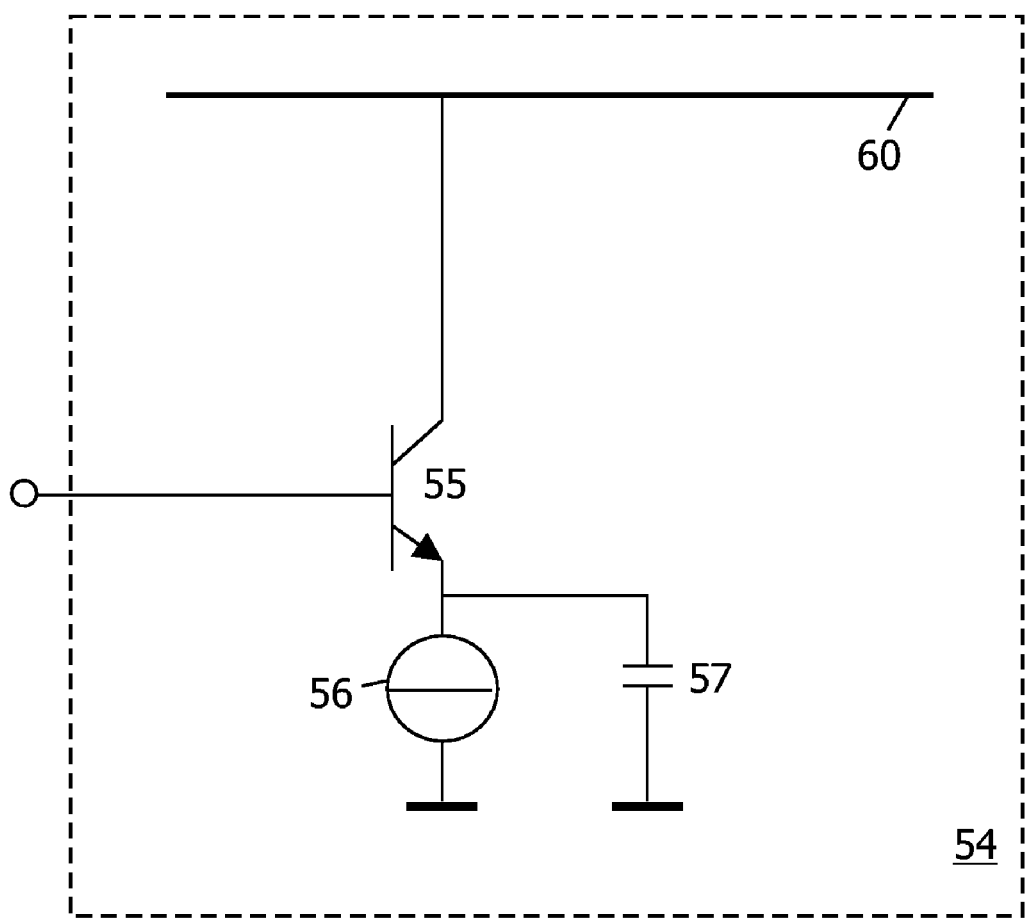
FIG. 4 shows means for compensating a series input impedance of the amplifier shown in FIG. 3 in greater detail.

The means 54 shown diagrammatically in FIG. 4 in greater detail for compensating a series input impedance of the amplifier 31-34 comprise a third transistor 55. A control electrode (base) of the third transistor 55 is coupled to a control electrode (base) of the second transistor 32. A first main electrode (emitter) of the third transistor 55 is coupled to ground via a parallel circuit of a current source 56 and a capacitor 57. A second main electrode (collector) of the third transistor 55 is coupled to a voltage supply 60. These means 54 provide a negative input resistance thereby compensating a series input impedance of the low noise amplifier 31-34 comprising the function of the inductor 8. This will be explained below at the hand of an impedance model.

By taking the low noise amplifier 10 and the inductor 8 from FIG. 1, an impedance model can be made. According to this impedance model, the port 11a is coupled via a serial circuit of a first impedance having a value $Z_1$ and a second impedance having a value $Z_1$ to the port 11b. A common point of this serial circuit is coupled via a third impedance having a value $Z_2$ to ground, and the port 11b is coupled via a fourth impedance having a value $Z_3$ to ground. Through the respective first and second and third impedances having a value $Z_1$ and having a value $Z_1$ and having a value $Z_2$, the respective currents $I_1$ and $I_3$ and $I_2$ are flowing, such that $I_1=I_2+I_3$. At the respective ports 11a and 11b, the respective voltages $+V_1$ and $-V_1$ are assumed to be present. In this case, a differential input impedance will be $Z_{diff}=2Z_1$, and a common mode input impedance will be $Z_{cm}=0.5\ Z_1+Z_2$.

Then it can be calculated that for example $Z_3=-Z_1$. So, the common point between the first impedance having a value $Z_1$ and the second impedance having a value $Z_1$ is equal to a virtual ground, which corresponds with a series input impedance compensation.

Any means 54 realizing the fourth impedance having a value $Z_3$, with $Z_3=-Z_1$, can be used. At 24 GHz, a noise figure under 5 dB can be reached.

Although bipolar NPN transistors have been used, other kinds of transistors such as bipolar PNP and FETs etc. might be used as well, for one or more of the transistors shown. Other means than the means 54 in the form of the third transistor coupled to the parallel circuit for compensating a series input impedance of the amplifier are not to be excluded, such as for example equivalent circuits and circuits for simulating the combination of the third transistor and the parallel circuit.

It should be noted that the above-mentioned embodiments illustrate rather than limit the invention, and that those skilled in the art will be able to design many alternative embodiments without departing from the scope of the appended claims as described in the European patent application 05100906.6 filed on the same date as the present application. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. In the receiver claim enumerating several means, several of these means may be embodied by one and the same item of hardware. The mere fact that certain measures are recited in mutually different dependent claims does not indicate that a combination of these measures cannot be used to advantage.

The invention claimed is:

1. A receiver comprising an amplifier configured to amplify an antenna signal, which amplifier comprises an amplifier input and an amplifier output, the amplifier input being a single ended input configured to receive the antenna signal, the amplifier output being a differential output, and the amplifier comprising a circuit configured to compensate a series input impedance of the amplifier.

2. A receiver according to claim 1, the amplifier comprising a first transistor and a second transistor, control electrodes of both transistors being coupled to each other via a first element, first main electrodes of both transistors being coupled to each other via a second element, and the circuit configured to compensate being coupled to the first element.

3. A receiver according to claim 2, the circuit comprising a third transistor, a control electrode of the third transistor being coupled to a control electrode of the second transistor, a first main electrode of the third transistor being coupled to ground via a parallel circuit of a current source and a capacitor, a second main electrode of the third transistor being coupled to a voltage supply.

4. A receiver according to claim 2, second main electrodes of both transistors being coupled to a cascode circuit comprising the amplifier output.

5. A receiver according to claim 2, the first element comprising a differential inductor with a center tap.

6. A receiver according to claim 5, the center tap being coupled to a voltage source.

7. A receiver according to claim 2, a control electrode of the first transistor being coupled via a further capacitor to the amplifier input.

8. An amplifier configured to amplify an antenna signal in a receiver, which amplifier comprises an amplifier input and an amplifier output, the amplifier input being a single ended input configured to receive the antenna signal, the amplifier output being a differential output, and the amplifier comprising a means for compensating a series input impedance of the amplifier.

9. A method of amplifying an antenna signal in a receiver, the method comprising:
    receiving an antenna signal at a single-ended input of an amplifier;
    compensating a series input impedance of the amplifier during amplification of the antenna signal; and
    outputting the amplified antenna signal at a differential output of the amplifier.

10. A method in accordance with claim 9 wherein compensating a series input impedance of the amplifier comprises providing a negative input resistance.

11. A method in accordance with claim 9 wherein compensating a series input impedance of the amplifier occurs in an absence of a noise generating resistor.

12. A method in accordance with claim 9 wherein compensating a series input impedance of the amplifier obtains an input power match.

13. A method in accordance with claim 9 wherein the amplifier comprises a first transistor and a second transistor, a first element coupling control electrodes of the first and second transistors to each other, and a second element coupling first main electrodes of the first and second transistors to each other, and wherein a circuit configured to compensate a series input impedance of the amplifier is coupled to the first element.

14. A method in accordance with claim 13 wherein the circuit comprises a third transistor, the third transistor comprising:
    a control electrode coupled to a control electrode of the second transistor,
    a first main electrode coupled to ground via a parallel circuit of a current source and a first capacitor, and
    a second main electrode coupled to a voltage supply.

15. A method in accordance with claim 13 wherein second main electrodes of the first and second transistors are coupled to a cascode circuit comprising the differential output of the amplifier.

16. A method in accordance with claim 13 wherein the first element comprises a differential inductor with a center tap.

17. A method in accordance with claim 16 wherein the center tap is coupled to a voltage source.

18. A method in accordance with claim 13 wherein the first element comprises two serial inductors.

19. A method in accordance with claim 18 wherein the common point of the two serial inductors is coupled to a voltage source.

20. A method in accordance with claim 13 wherein a control electrode of the first transistor is coupled to the single-ended amplifier input via a second capacitor.

* * * * *